(12) United States Patent
Kim et al.

(10) Patent No.: US 11,094,237 B2
(45) Date of Patent: Aug. 17, 2021

(54) DISPLAY DEVICE WITH CONNECTION BOARD AND METHOD OF TESTING PAD CONTACT STATE THEREOF

(71) Applicant: Samsung Display Co., LTD., Yongin-si (KR)

(72) Inventors: Sung-Jun Kim, Hwaseong-si (KR); Myung-Seok Kwon, Namyangju-si (KR); Deok-Hwan Kim, Asan-si (KR); Yun-Tae Kim, Seoul (KR); Jeong-Hyun Kim, Seongnam-si (KR); Hasook Kim, Hwaseong-si (KR); Bongchun Park, Incheon (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/847,663

(22) Filed: Apr. 14, 2020

(65) Prior Publication Data

US 2020/0402433 A1 Dec. 24, 2020

(30) Foreign Application Priority Data

Jun. 20, 2019 (KR) .................. KR10-2019-0073629

(51) Int. Cl.
*G09G 3/00* (2006.01)
*G01R 31/28* (2006.01)

(52) U.S. Cl.
CPC ......... *G09G 3/006* (2013.01); *G01R 31/2884* (2013.01); *G01R 31/2896* (2013.01); *G09G 2300/0426* (2013.01); *G09G 2330/12* (2013.01)

(58) Field of Classification Search
CPC ........... G09G 3/006; G09G 2300/0426; G09G 2330/12; G01R 31/2896; G01R 31/2884
USPC ....................... 324/537, 500, 76.11
See application file for complete search history.

(56) References Cited

U.S. PATENT DOCUMENTS 9,377,635 B2 6/2016 Kim et al.
10,971,077 B2* 4/2021 Kwon .................. G09G 3/2007
10,971,560 B2* 4/2021 Kim ....................... G09G 3/006
(Continued)

FOREIGN PATENT DOCUMENTS

KR 1020140084632 A 7/2014
KR 1020140122481 A 10/2014
KR 1020150072263 A 6/2015
(Continued)

*Primary Examiner* — Giovanni Astacio-Oquendo
(74) *Attorney, Agent, or Firm* — Cantor Colburn LLP

(57) ABSTRACT

A display device includes a display panel including first to fourth panel pads and a connection board including first to fourth connection board pads coupled to the first to fourth pads, respectively. The first and second panel pads are electrically connected to each other, and the third and fourth panel pads are electrically connected to each other. The connection board includes a driving circuit which generates a first test result signal based on a first panel test signal transmitted to the first connection board pad and a first panel feedback signal received from the second connection board pad, generates a second test result signal based on a second panel test signal transmitted to the third connection board pad and a second panel feedback signal received from the fourth connection board pad, and sequentially outputs the first and second test result signals as a test result signal.

20 Claims, 12 Drawing Sheets

(56) References Cited

U.S. PATENT DOCUMENTS 10,971,567 B2 * 4/2021 Lee .................... H01L 27/3258

FOREIGN PATENT DOCUMENTS

| KR | 101830606 B1 | 4/2018 |
| KR | 1020190014984 A | 2/2019 |

* cited by examiner

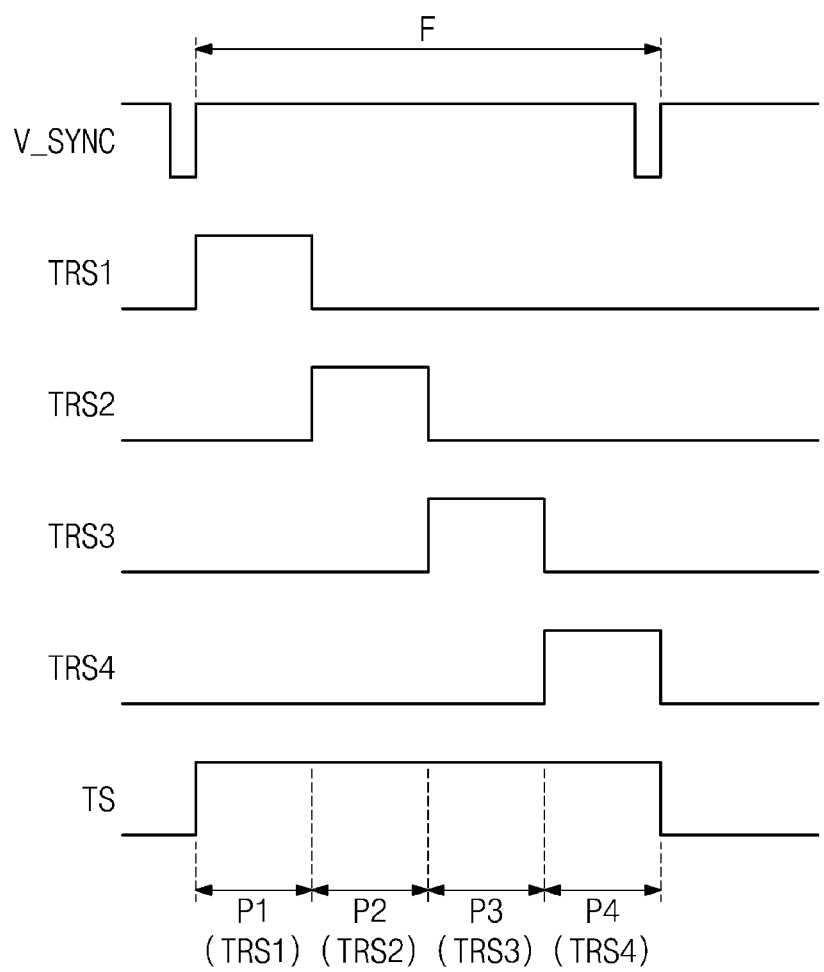

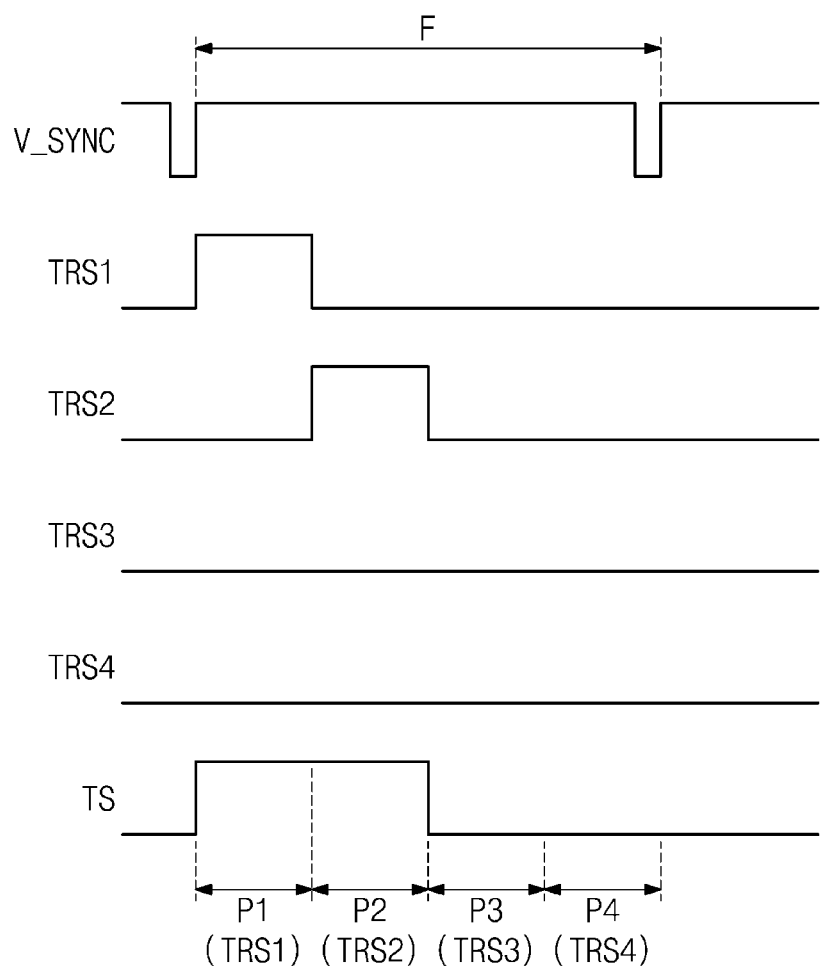

DISPLAY DEVICE WITH CONNECTION BOARD AND METHOD OF TESTING PAD CONTACT STATE THEREOF

This application claims priority to Korean Patent Application No. 10-2019-0073629, filed on Jun. 20, 2019, and all the benefits accruing therefrom under 35 U.S.C. § 119, the content of which in its entirety is herein incorporated by reference.

BACKGROUND OF THE INVENTION

Exemplary embodiments of the present disclosure relate to a display device, and in particular, to a display device including a display panel and a connection board electrically connected to each other.

Various display devices are being developed for use in multimedia devices such as televisions, mobile phones, tablet computers, navigation systems, gaming machines, and the like. An organic light emitting display device, which is one of the display devices, includes an organic light emitting diode generating light constituting an image, through recombination between electrons and holes. The organic light emitting display device has technical advantages, such as fast response speed and low power consumption.

The organic light emitting display device includes a display panel which is used to display an image, a host device which provides control and image signals for controlling operations of the display panel, and a connection board which is used to provide the control and image signals from the host device to the display panel.

SUMMARY

The connection board includes a plurality of circuit boards which may be coupled to each other through pads. For example, pads of the circuit board should be coupled to pads of the display panel in a fully stable manner, and only in such a case, the control and image signals can be transmitted to the display panel without any signal distortion issue.

An exemplary embodiment of the inventive concept provides a display device which includes a connection board and is configured to allow for testing a contact state of pads.

An exemplary embodiment of the inventive concept provides a method of testing a pad contact state in a display device configured to allow for testing a contact state of pads.

According to an exemplary embodiment of the inventive concept, a display device includes a display panel including first to fourth panel pads and a connection board including first to fourth connection board pads coupled to the first to fourth pads, respectively. The first panel pad and the second panel pad are electrically connected to each other, and the third panel pad and the fourth panel pad are electrically connected to each other. The connection board includes a driving circuit which is connected to the first to fourth connection board pads, generates a first test result signal based on a first panel test signal transmitted to the first connection board pad and a first panel feedback signal received from the second connection board pad, generates a second test result signal based on a second panel test signal transmitted to the third connection board pad and a second panel feedback signal received from the fourth connection board pad, and sequentially outputs the first test result signal and the second test result signal as a test result signal.

In an exemplary embodiment, the driving circuit may be an integrated circuit, and the connection board may be composed of a chip-on-film, on which the driving circuit can be mounted.

In an exemplary embodiment, the first panel pad and the second panel pad may be arranged in a side region of the display panel. The third panel pad and the fourth panel pad may be spaced apart from the first panel pad and the second panel pad and may be arranged in an opposite side region of the display panel.

In an exemplary embodiment, the driving circuit may generate the first test result signal of a first level, when a first difference between the first panel test signal and the first panel feedback signal is smaller than a predetermined value, and may generate the first test result signal of a second level different from the first level, when the first difference is greater than or equal to the predetermined value. The driving circuit may generate the second test result signal of the first level, when a second difference between the second panel test signal and the second panel feedback signal is smaller than the predetermined value, and may generate the second test result signal of the second level, when the second difference is greater than or equal to the predetermined value.

In an exemplary embodiment, the display panel may further include a plurality of panel pads. The connection board may further include a plurality of connection board pads coupled to the plurality of panel pads, respectively. At least one of the plurality of panel pads and the plurality of connection board pads may be an image signal pad used to transmit an image signal.

In an exemplary embodiment, the first panel pad and the second panel pad may be arranged at a side of the plurality of panel pads, and the third panel pad and the fourth panel pad may be arranged at an opposite side of the plurality of panel pads.

In an exemplary embodiment, the display panel may further include a fifth panel pad and a sixth panel pad electrically connected to each other, and a seventh panel pad and an eighth panel pad electrically connected to each other. The connection board may further include fifth to eighth connection board pads coupled to the fifth to eighth panel pads, respectively. The driving circuit may be electrically connected to the fifth to eighth connection board pads, may further generate a third test result signal based on a fifth panel test signal transmitted to the fifth connection board pad and a third panel feedback signal received from the sixth connection board pad, may generate a fourth test result signal based on a fourth panel test signal transmitted to the seventh connection board pad and a fourth panel feedback signal received from the eighth connection board pad, and may sequentially output the first to fourth test result signals as the test result signal.

In an exemplary embodiment, the fifth to eighth panel pads may be arranged between the plurality of panel pads.

In an exemplary embodiment, the connection board may further include a connection board output pad, and the driving circuit may sequentially output the first to fourth test result signals to the connection board output pad, during one frame.

In an exemplary embodiment, the display device may further include a main circuit board including an output receiving pad coupled to the connection board output pad. The main circuit board may further include a main controller, which receives the first test result signal and the second test result signal through the output receiving pad.

In an exemplary embodiment, the main circuit board may further include first to fourth main board pads. The connection board may further include first to fourth main contact pads coupled to the first to fourth main board pads, respectively. The driving circuit may be electrically connected to the first to fourth main board pads, may further generate a fifth test result signal based on a first main board test signal transmitted to the first main contact pad and a first main board feedback signal received from the second main contact pad, may generate a sixth test result signal based on a second main board test signal transmitted to the third main contact pad and a second main contact feedback signal received from the fourth main contact pad, and may sequentially output the first to sixth test result signals as the test result signal.

In an exemplary embodiment, the driving circuit may sequentially output the first to sixth test result signals to the connection board output pad, during one frame.

In an exemplary embodiment, the first main board pad and the second main substrate pad may be arranged in a side region of the main circuit substrate. The third main substrate pad and the fourth main substrate pad may be spaced apart from the first main substrate pad and the second main substrate pad and may be arranged in an opposite side region of the main circuit substrate.

According to an exemplary embodiment of the inventive concept, a display device includes a display panel including a plurality of panel pads, a plurality of connection substrates, each of which includes first to fourth connection substrate pads and a connection board output pad, and a main circuit board including a plurality of output receiving pads coupled to the connection board output pads of the plurality of connection boards. The plurality of panel pads includes first and second panel pads electrically connected to each other, and third and fourth panel pads electrically connected to each other. The first to fourth connection board pads of one of the plurality of connection boards are coupled to the first to fourth panel pads, respectively. Each of the plurality of connection boards includes a driving circuit. The driving circuit of the one of the plurality of connection boards is electrically connected to the first to fourth connection board pads, generates a first test result signal based on a first panel test signal transmitted to the first connection board pad, a first panel feedback signal received from the second connection board pad, a second panel test signal transmitted to the third connection board pad, and a second panel feedback signal received from the fourth connection board pad, and outputs the first test result signal to the connection board output pad.

In an exemplary embodiment, each of the driving circuits may be an integrated circuit. Each of the plurality of connection boards may be composed of a chip-on-film, on which the driving circuit can be mounted.

In an exemplary embodiment, the driving circuit may generate the first test result signal of a first level, when a first difference between the first panel test signal and the first panel feedback signal is smaller than a predetermined value and a second difference between the second panel test signal and the second panel feedback signal is smaller than the predetermined value, and may generate the first test result signal of a second level different from the first level, when at least one of the first difference and the second difference is greater than or equal to the predetermined value.

In an exemplary embodiment, each of the driving circuits may output the first test result signal in a corresponding one of different periods of one frame.

According to an exemplary embodiment of the inventive concept, a method of testing a pad contact state of a display device including a display panel and a connection board is provided. The display panel includes a first panel pad and a second panel pad electrically connected to each other, and a third panel pad and a fourth panel pad electrically connected to each other, and the connection board includes first to fourth connection board pads. The method includes coupling the first to fourth connection board pads to the first to fourth panel pads, respectively, transmitting a first panel test signal to the first connection board pad and transmitting a second panel test signal to the third connection board pad, receiving a first panel feedback signal from the second connection board pad and receiving a second panel feedback signal from the fourth connection board pad, generating a first test result signal, based on a first difference between the first panel test signal and the first panel feedback signal, generating a second test result signal based on a second difference between the second panel test signal and the second panel feedback signal, and sequentially outputting the first test result signal and the second test result signal.

In an exemplary embodiment, the connection board may further include a connection board output pad. The outputting of the first and second test result signals may be executed to sequentially output the first test result signal and the second test result signal to the connection board output pad during one frame.

In an exemplary embodiment, the outputting of the first and second test result signals may be executed to generate the first test result signal of a first level, when the first difference between the first panel test signal and the first panel feedback signal is smaller than a predetermined value, and to generate the first test result signal of a second level different from the first level, when the first difference is greater than or equal to the predetermined value. The outputting of the first and second test result signals may further be executed to generate the second test result signal of the first level, when the second difference between the second panel test signal and the second panel feedback signal is smaller than the predetermined value, and to generate the second test result signal of the second level, when the second difference is greater than or equal to the predetermined value.

BRIEF DESCRIPTION OF THE DRAWINGS

Exemplary embodiments will be more clearly understood from the following brief description taken in conjunction with the accompanying drawings. The accompanying drawings represent non-limiting, exemplary embodiments as described herein.

FIGS. 10A and 10B are timing diagrams exemplarily illustrating first to fourth test result signals, which are output from first to fourth driving circuits, and a test result signal, which is received by a main controller.

Figure 1:
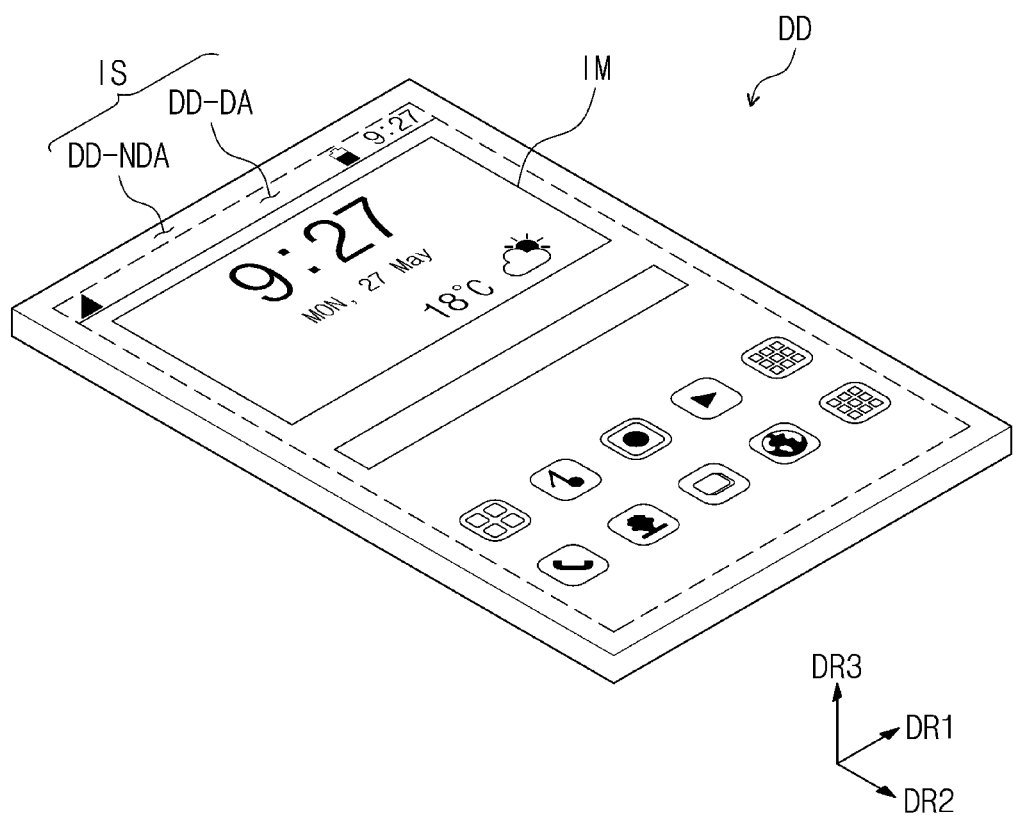
FIG. 1 is a perspective view illustrating an exemplary embodiment of a display device according to the inventive concept.

It should be noted that these figures are intended to illustrate the general characteristics of methods, structure and/or materials utilized in certain exemplary embodiments and to supplement the written description provided below. These drawings are not, however, to scale and may not precisely reflect the precise structural or performance characteristics of any given exemplary embodiment, and should not be interpreted as defining or limiting the range of values or properties encompassed by exemplary embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Exemplary embodiments of the inventive concepts will now be described more fully with reference to the accompanying drawings, in which exemplary embodiments are shown. Exemplary embodiments of the inventive concepts may, however, be embodied in many different forms and should not be construed as being limited to the exemplary embodiments set forth herein; rather, these exemplary embodiments are provided so that this disclosure will be thorough and complete, and will fully convey the concept of exemplary embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Exemplary embodiments of the inventive concepts are described herein with reference to cross-sectional illustrations that are schematic illustrations of idealized exemplary embodiments (and intermediate structures) of exemplary embodiments. As such, variations from the shapes of the illustrations as a result, for example, of manufacturing techniques and/or tolerances, are to be expected. Thus, exemplary embodiments of the inventive concepts should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which exemplary embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a perspective view illustrating an exemplary embodiment of a display device according to the inventive concept.

Referring to FIG. 1, a display device DD may be a liquid crystal display device, a field emission display device, a plasma display device, or an organic light emitting display device. However, the display device DD according to an exemplary embodiment of the inventive concept is not limited to the display devices listed above.

FIG. 1 illustrates an example, in which the display device DD is a flat panel display device. However, the inventive concept is not limited to this example, and in another exemplary embodiment, the display device DD may be one of foldable, rollable, or bendable display devices and so forth. The display device DD may be used for large-sized electronic devices (e.g., television sets and monitors) or small- or medium-sized electronic devices (e.g., smart phones, tablets, car navigation systems, game machines, and smart watches).

The display device DD may include a display surface IS, which is parallel to a plane defined by a first direction DR1 and a second direction DR2 as shown in FIG. 1 and is used to display an image IM. The display surface IS of the display device DD may include a plurality of regions. The display device DD may include a display region DD-DA, on which the image IM is displayed, and a non-display region DD-NDA, which is disposed adjacent to the display region DD-DA. The non-display region DD-NDA may be a region, which is not used to display an image.

In an exemplary embodiment, the display region DD-DA may have a rectangular shape. The non-display region DD-NDA may enclose the display region DD-DA. However, the inventive concept is not limited thereto, and the shapes of the display and non-display regions DD-DA and DD-NDA may be variously changed in a mutually influential manner.

Figure 2:
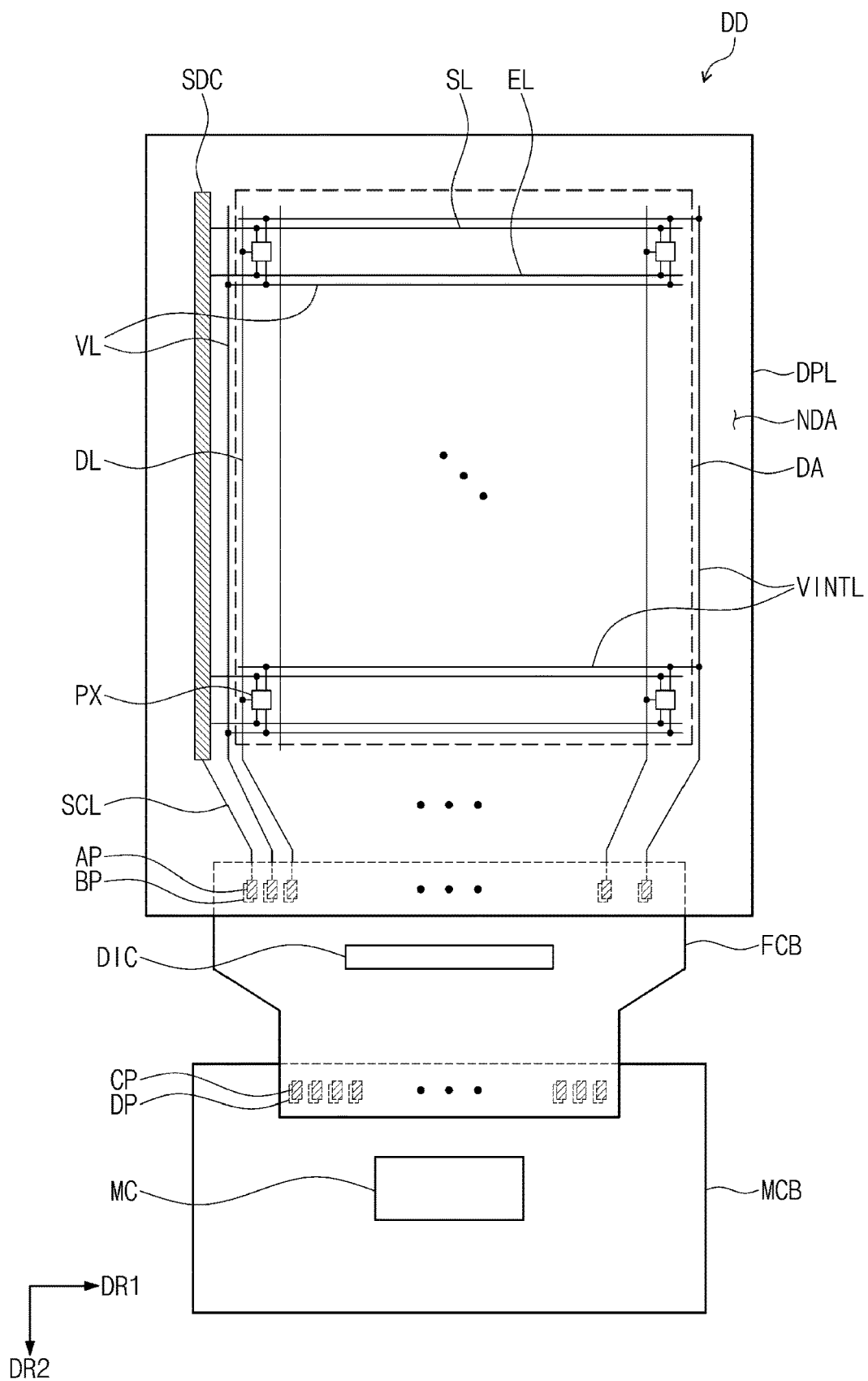
FIG. 2 is a plan view illustrating an exemplary embodiment of a display device according to the inventive concept.
Figure 3:
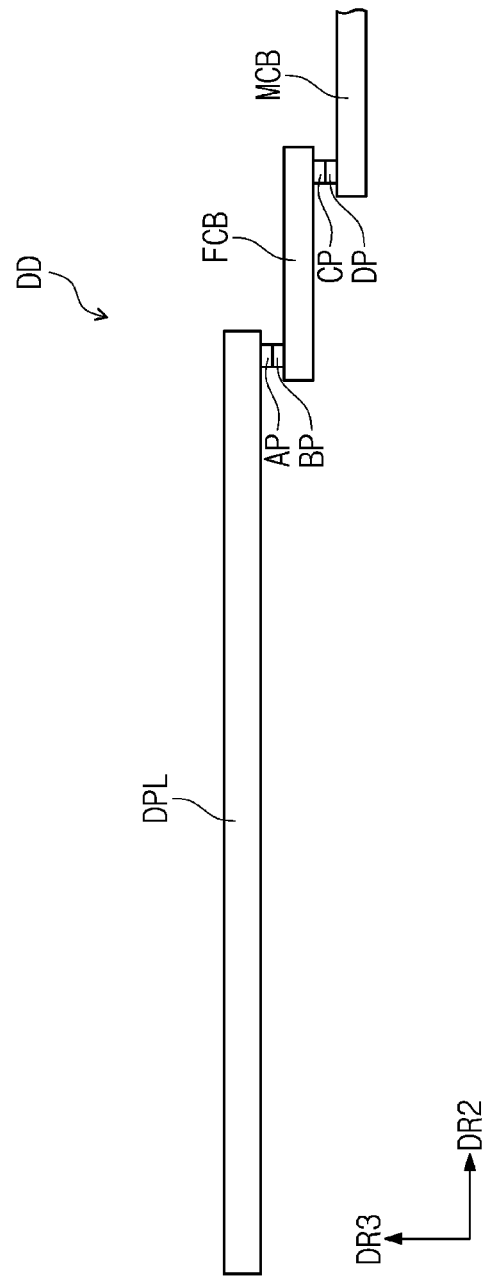
FIG. 3 is a sectional view illustrating an example of connection between a display panel and a connection board, according to an exemplary embodiment of the inventive concept.

FIG. 2 is a plan view illustrating an exemplary embodiment of the display device DD according to the inventive concept. FIG. 3 is a sectional view illustrating an example of connection between a display panel and a connection board, according to an exemplary embodiment of the inventive concept.

Referring to FIGS. 2 and 3, the display device DD may include a display panel DPL, a connection board FCB, and a main circuit board MCB.

In a plan view, the display panel DPL may include a display region DA and a non-display region NDA. The display and non-display regions DA and NDA of the display panel DPL may correspond to the display and non-display regions DD-DA and DD-NDA, respectively, of the display device DD (e.g., see FIG. 1). In another exemplary embodiment, the display and non-display regions DA and NDA of the display panel DPL may not be the same as the display and non-display regions DD-DA and DD-NDA, respectively, of the display device DD (e.g., see FIG. 1) and may be changed according to the structure and/or design of the display panel DPL.

The display panel DPL may include a plurality of pixels PX. A region, in which the plurality of pixels PX are disposed, may be defined as the display region DA. In an exemplary embodiment, the non-display region NDA may be defined along a boundary of the display region DA.

Referring to FIG. 2, the display panel DPL may include scan lines SL, data lines DL, emission lines EL, a scan control line SCL, an initializing voltage line VINTL, and a voltage line VL.

A scan driving circuit SDC, to which the scan lines SL and the emission lines EL are connected, may be disposed in a side region of the non-display region NDA.

The scan lines SL may be extended from the scan driving circuit SDC in the first direction DR1 and may be connected to corresponding pixels PX, respectively. Each of the emission lines EL may be extended from the scan driving circuit SDC in the first direction DR1 and may be arranged to be parallel to a corresponding one of the scan lines SL. The data lines DL may be extended in the second direction DR2 and may be connected to corresponding pixels PX, respectively. The scan control line SCL may provide control signals to the scan driving circuit SDC. The initializing voltage line VINTL may provide an initialization voltage to a plurality of the pixels PX. The initializing voltage line VINTL may include a plurality of lines, which are extended in the first direction DR1, and a plurality of lines, which are extended in the second direction DR2. The voltage line VL may be connected to a plurality of the pixels PX and may provide a first voltage to the plurality of the pixels PX. The voltage line VL may include a plurality of lines, which are extended in the first direction DR1, and a plurality of lines, which are extended in the second direction DR2.

Some of the scan lines SL, the data lines DL, the emission lines EL, the scan control line SCL, the initializing voltage line VINTL, the voltage line VL may be disposed in the same layer, and the others may be disposed in the other layers.

Panel pads AP may be arranged on the non-display region NDA of the display panel DPL. The panel pads AP may be arranged in the first direction DR1. In FIG. 2, the panel pads AP are arranged to form a single row parallel to the first direction DR1, but the inventive concept is not limited to this example. In another exemplary embodiment, for example, the panel pads AP may be arranged to form two or more rows or a zigzag shape.

The data lines DL, the scan control line SCL, the initializing voltage line VINTL, and the voltage line VL may be connected to the panel pads AP.

The panel pads AP of the display panel DPL may be coupled to connection board pads BP of the connection board FCB. The connection board FCB may include a driving circuit DIC. The driving circuit DIC may be composed of an integrated circuit ("IC"). The connection board FCB may be a flexible printed circuit board, on which the driving circuit DIC or the integrated circuit can be mounted. For example, the connection board FCB may be a chip-on-film ("COF"). FIG. 2 illustrates an example, in which only one driving circuit DIC is mounted on the connection board FCB, but in certain exemplary embodiments, a plurality of integrated circuits may be mounted on the connection board FCB. The driving circuit DIC may include, for example, a driving controller, a data driver, a voltage generator, and so forth.

Although not shown in the drawings, a plurality of lines, which are used to electrically connect the connection board pads BP to the driving circuit DIC, may be arranged on the connection board FCB.

The panel pads AP may be arranged on a bottom surface of the display panel DPL, and the connection board pads BP may be arranged on a top surface of the connection board FCB. When the panel pads AP and the connection board pads BP are coupled to each other, the panel pads AP and the connection board pads BP may not be seen through a top surface of the display panel DPL (e.g., in a plan view). Thus, in FIG. 2, the panel pads AP and the connection board pads BP are depicted by dotted lines. In certain exemplary embodiments, the panel pads AP may be arranged on the top surface of the display panel DPL, and the connection board pads BP may be arranged on a bottom surface of the connection board FCB. In this case, when the panel pads AP and the connection board pads BP are coupled to each other, a region of the connection board FCB may be overlapped with a portion of an upper region of the display panel DPL in the plan view.

The connection board FCB may further include main contact pads CP. The main circuit board MCB may include main board pads DP. In this exemplary embodiment, the main contact pads CP may be arranged on the bottom surface of the connection board FCB, and the main board pads DP may be arranged on a top surface of the main circuit board MCB. The main contact pads CP of the connection board FCB may be coupled to the main board pads DP of the main circuit board MCB. In this exemplary embodiment, the main contact pad CP and the main board pad DP are terms that are defined for the purpose of convenience in description, and it will be understood that the scope of the inventive concept should not be limited by these terms. In certain exemplary embodiments, the main contact pads CP may be arranged on the top surface of the connection board FCB, and the main board pads DP may be arranged on a bottom surface of the main circuit board MCB. In this case, when the main contact pads CP are coupled with the main board pads DP, a partial region of the main circuit board MCB may be overlapped with a portion of an upper region of the connection board FCB.

The main circuit board MCB may include a main controller MC. The main circuit board MCB may further include signal lines (not shown), which are used to transmit control signals and image signals from the main controller MC to the main board pads DP. The main circuit board MCB may be a rigid or flexible printed circuit board.

In order to provide a better understanding of a contact between the panel pads AP and the connection board pads BP, FIG. 2 illustrates an example, in which the panel pads AP and the connection board pads BP are slightly shifted from each other. Preferably, the panel pads AP and the connection board pads BP may be coupled to each other in a fully stable manner, as shown in FIG. 3.

The control signals and the image signals, which are provided from the driving circuit DIC, may be transmitted to the display panel DPL without any signal distortion issue, only when the panel pads AP and the connection board pads BP are coupled to each other in a fully stable manner.

Similarly, in order to provide a better understanding of a contact between the main contact pads CP and the main board pads DP, FIG. 2 illustrates an example, in which the main contact pads CP and the main board pads DP are slightly shifted from each other. Preferably, the main contact pads CP and the main board pads DP may be coupled to each other in a fully stable manner, as shown in FIG. 3.

The control signals and image signals, which are provided from the main controller MC, may be transmitted to the driving circuit DIC without any signal distortion issue, only when the main contact pads CP and the main board pads DP are coupled to each other in a fully stable manner.

Figure 4:
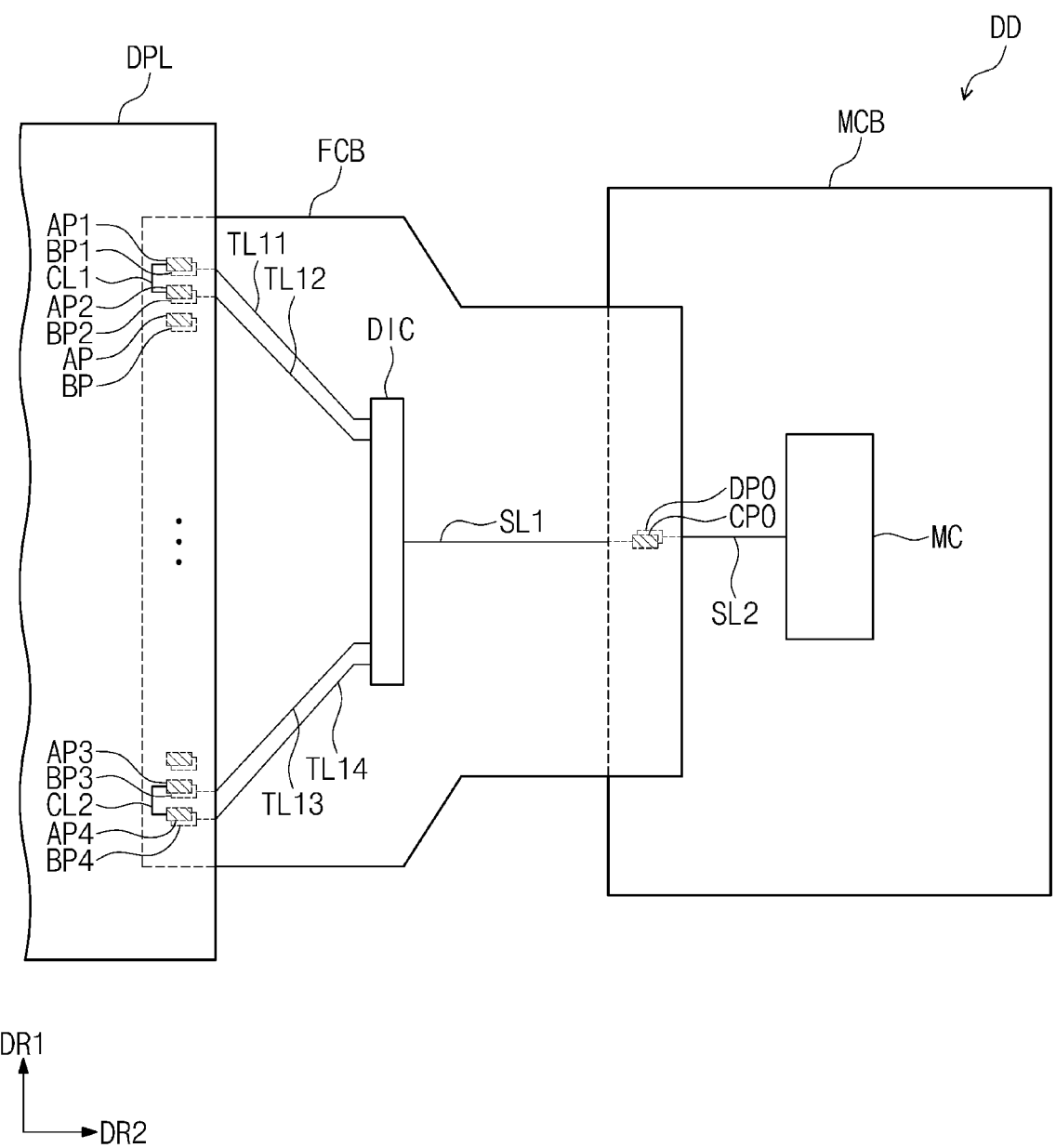
FIG. 4 is a plan view illustrating an exemplary embodiment of a contact between a display panel and a connection board and a contact between a connection board and a main board, according to the inventive concept.
Figure 5A:
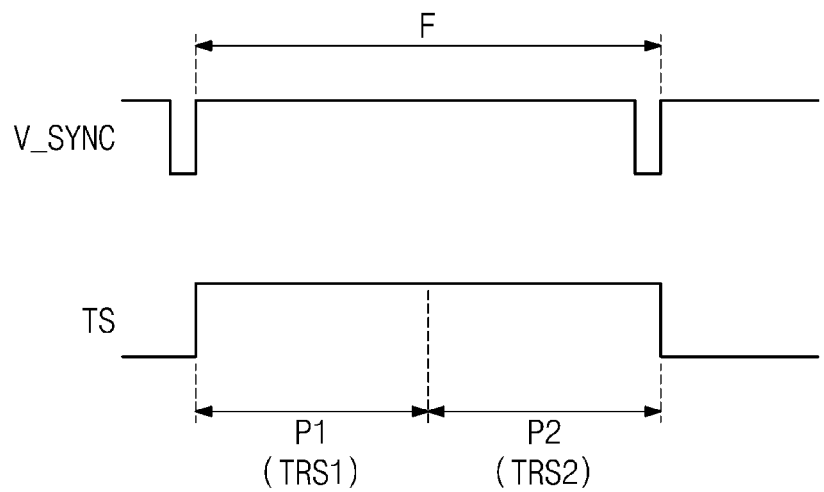
FIGS. 5A and 5B are timing diagrams exemplarily illustrating a test result signal output from a driving circuit.
Figure 5B:
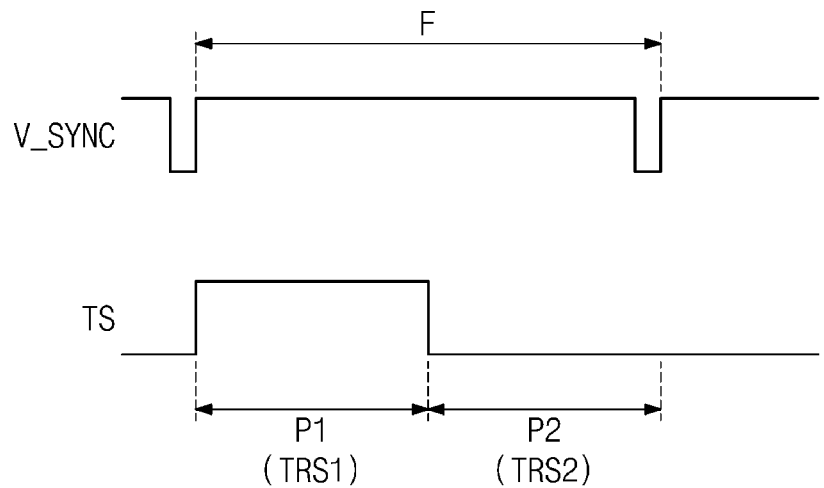

FIG. 4 is a plan view illustrating an exemplary embodiment of a contact between a display panel and a connection board and a contact between a connection board and a main board, according to the inventive concept. FIGS. 5A and 5B are timing diagrams exemplarily illustrating a test result signal TS output from the driving circuit DIC.

Referring to FIG. 4, the display panel DPL may include first to fourth panel pads AP1-AP4 and the panel pads AP. The first panel pad AP1 and the second panel pad AP2 may be electrically connected to each other through a first connection line CL1. The third panel pad AP3 and the fourth panel pad AP4 may be electrically connected to each other through a second connection line CL2.

The first panel pad AP1 and the second panel pad AP2 may be disposed adjacent to a side of a display panel DPL, and the third panel pad AP3 and the fourth panel pad AP4 may be disposed adjacent to an opposite side of the display panel DPL2 as shown in FIG. 4. In other words, the first panel pad AP1 and the second panel pad AP2 may be spaced apart from the third panel pad AP3 and the fourth panel pad AP4 in the first direction DR1.

The connection board FCB may include first to fourth connection board pads BP1-BP4 and the connection board pads BP. The first to fourth connection board pads BP1-BP4 may be coupled to the first to fourth panel pads AP1-AP4, respectively. The connection board pads BP may be coupled to the panel pads AP, respectively. The connection board pads BP and the panel pads AP may be electrically connected to the data lines DL, the scan control line SCL, the initializing voltage line VINTL, and the voltage line VL shown in FIG. 2.

The connection board FCB may further include first to fourth panel test lines TL11-TL14. The driving circuit DIC may be electrically connected to the first to fourth connection board pads BP1-BP4 through the first to fourth panel test lines TL11-TL14, respectively.

In addition, the connection board FCB may include a connection board output pad CPO. The connection board output pad CPO may be electrically connected to the driving circuit DIC through a first signal line SL1.

The main circuit board MCB may include an output receiving pad DPO. The output receiving pad DPO may be coupled to the connection board output pad CPO. The output receiving pad DPO may be electrically connected to the main controller MC through a second signal line SL2.

The driving circuit DIC may transmit a first panel test signal to the first connection board pad BP1 through the first panel test line TL11 and may receive a first panel feedback signal from the second connection board pad BP2 through the second panel test line TL12. More specifically, the first panel test signal, which is output from the driving circuit DIC, may be returned to the driving circuit DIC as the first panel feedback signal, through the first panel test line TL11, the first connection board pad BP1, the first panel pad AP1, the first connection line CL1, the second panel pad AP2, the second connection board pad BP2, and the second panel test line TL12. The driving circuit DIC may generate a first test result signal TRS1, based on the first panel test signal and the first panel feedback signal.

If the first connection board pad BP1 and the first panel pad AP1 are coupled to each other in a fully stable manner and the second connection board pad BP2 and the second panel pad AP2 are coupled to each other in a fully stable manner, a first difference between the first panel test signal and the first panel feedback signal (e.g., a difference in voltage level between the first panel test signal and the first panel feedback signal) may be smaller than a predetermined value. In this case, the driving circuit DIC may generate the first test result signal TRS1 of a first level (e.g., high level).

If the first connection board pad BP1 and the first panel pad AP1 are not coupled to each other in a fully stable manner or the second connection board pad BP2 and the second panel pad AP2 are not coupled to each other in a fully stable manner, the first difference between the first panel test signal and the first panel feedback signal may be greater than or equal to the predetermined value. In this case, the driving circuit DIC may generate the first test result signal TRS1 of a second level (e.g., low level).

The driving circuit DIC may transmit a second panel test signal to the third connection board pad BP3 through the third panel test line TL13 and may receive a second panel feedback signal from the fourth connection board pad BP4 through the fourth panel test line TL14. The driving circuit DIC may generate a second test result signal TRS2, based on the second panel test signal and the second panel feedback signal. The second panel test signal, which is output from the driving circuit DIC, may be returned to the driving circuit DIC, as the second panel feedback signal, through the third panel test line TL13, the third connection board pad BP3, the third panel pad AP3, the second connection line CL2, the fourth panel pad AP4, the fourth connection board pad BP4, and the fourth panel test line TL14. The driving circuit DIC may generate the second test result signal TRS2, based on the second panel test signal and the second panel feedback signal.

If the third connection board pad BP3 and the third panel pad AP3 are coupled to each other in a fully stable manner and the fourth connection board pad BP4 and the fourth panel pad AP4 are coupled to each other in a fully stable manner, a second difference between the second panel test signal and the second panel feedback signal (e.g., a difference in voltage level of the second panel test signal and the second panel feedback signal) may be smaller than a predetermined value. In this case, the driving circuit DIC may generate the second test result signal TRS2 of the first level (e.g., high level).

If the third connection board pad BP3 and the third panel pad AP3 are not coupled to each other in a fully stable manner or the fourth connection board pad BP4 and the fourth panel pad AP4 are not coupled to each other in a fully stable manner, the second difference between the second panel test signal and the second panel feedback signal may be greater than or equal to the predetermined value. In this case, the driving circuit DIC may generate the second test result signal TRS2 of the second level (e.g., low level).

The driving circuit DIC may sequentially output the first test result signal TRS1 and the second test result signal TRS2 as the test result signal TS. The test result signal TS, which is output from the driving circuit DIC, may be transmitted to the main controller MC through the first signal line SL1, the connection board output pad CPO, the output receiving pad DPO, and the second signal line SL2.

Referring to FIG. 5A, the main controller MC may provide a synchronization signal V_SYNC to the driving circuit DIC. The synchronization signal V_SYNC may be a vertical synchronization signal whose transition occurs every frame F of an image signal. The driving circuit DIC may sequentially output the first test result signal TRS1 and the second test result signal TRS2 as the test result signal TS in synchronization with the synchronization signal V_SYNC. In certain exemplary embodiments, the driving circuit DIC may sequentially output the first test result signal TRS1 and the second test result signal TRS2 as the test result signal TS, in synchronization with one of other synchronization signals (e.g., horizontal synchronization signal or clock signal), not with the vertical synchronization signal.

One frame F of the synchronization signal V_SYNC may include a first period P1 and a second period P2. The driving circuit DIC may output the first test result signal TRS1 as the test result signal TS during the first period P1 of one frame F and may output the second test result signal TRS2 as the test result signal TS during the second period P2. If the first connection board pad BP1 and the first panel pad AP1 are coupled to each other in a fully stable manner and the second connection board pad BP2 and the second panel pad AP2 are coupled to each other in a fully stable manner, the first test result signal TRS1 may be at a first level (e.g., high level). If the third connection board pad BP3 and the third panel pad AP3 are coupled to each other in a fully stable manner and the fourth connection board pad BP4 and the fourth panel pad AP4 are coupled to each other in a fully stable manner, the second panel test signal may be at the first level (e.g., high level). In this case, the test result signal TS may be at the high level in each of the first period P1 and the second period P2.

Referring to FIG. 5B, if the first connection board pad BP1 and the first panel pad AP1 are coupled to each other in a fully stable manner and the second connection board pad BP2 and the second panel pad AP2 are coupled to each other in a fully stable manner, the first test result signal TRS1 may be at the first level (e.g., high level). If the third connection board pad BP3 and the third panel pad AP3 are not coupled to each other in a fully stable manner or the fourth connection board pad BP4 and the fourth panel pad AP4 are not coupled to each other in a fully stable manner, the second panel test signal may be at the second level (e.g., low level). In this case, the test result signal TS may be at the high level in the first period P1 and at the low level in the second period P2.

The main controller MC may receive the test result signal TS from the driving circuit DIC and may determine a contact state between the display panel DPL and the connection board FCB, based on a signal level of the test result signal TS, in each of the first period P1 and the second period P2 in one frame F. For example, if, in the first period P1 of one frame F, the test result signal TS is at the high level, the main controller MC may determine that the first connection board pad BP1 and the first panel pad AP1 are coupled to each other in a fully stable manner and that the second connection board pad BP2 and the second panel pad AP2 are coupled to each other in a fully stable manner. For example, if, in the second period P2 of one frame F, the test result signal TS is at the low level, the main controller MC may determine that the third connection board pad BP3 and the third panel pad AP3 are not coupled to each other in a fully stable manner or the fourth connection board pad BP4 and the fourth panel pad AP4 are not coupled to each other in a fully stable manner.

Figure 6:
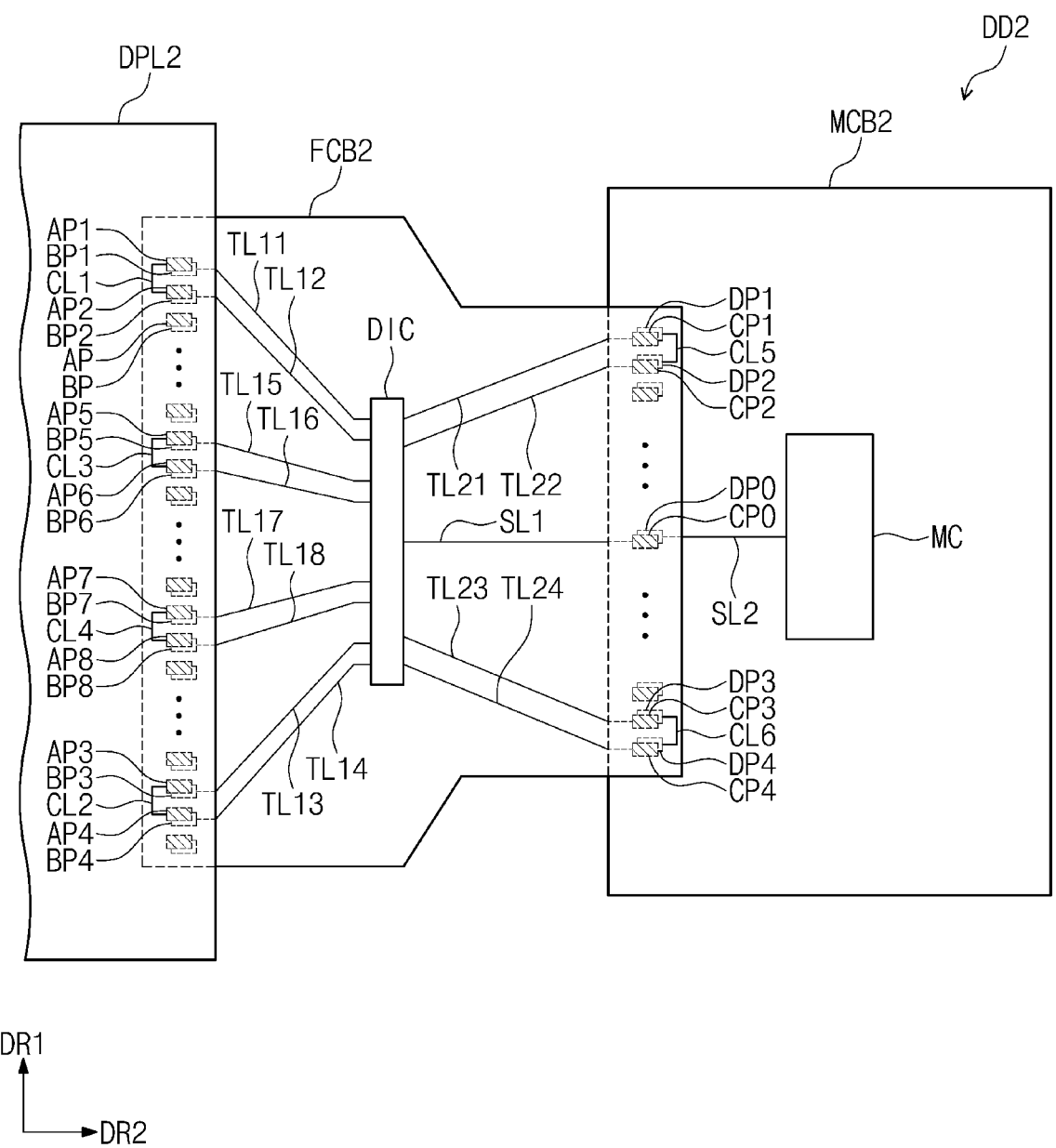
FIG. 6 is a plan view illustrating an exemplary embodiment of a contact between a display panel and a connection board and a contact between a connection board and a main board, according to the inventive concept.
Figure 7A:
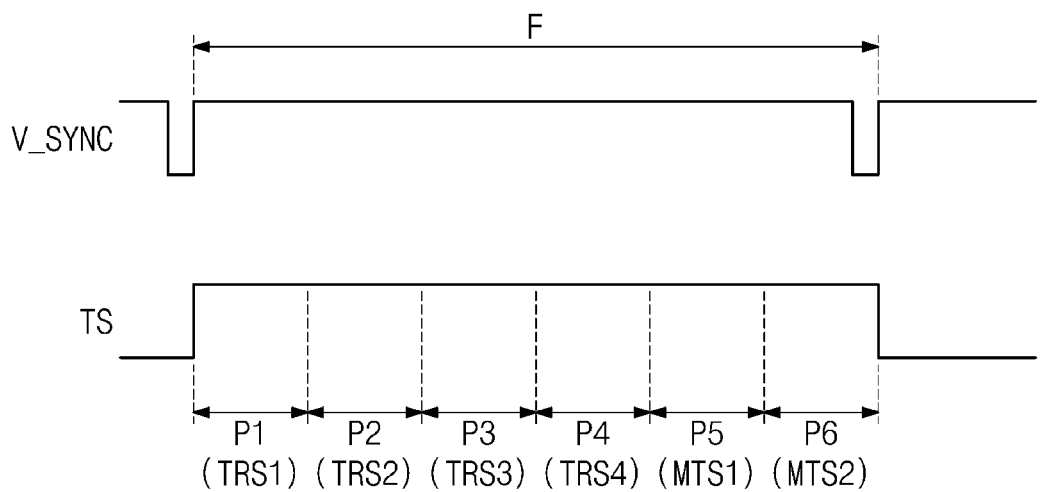
FIGS. 7A to 7C are timing diagrams exemplarily illustrating a test result signal output from a driving circuit.
Figure 7B:
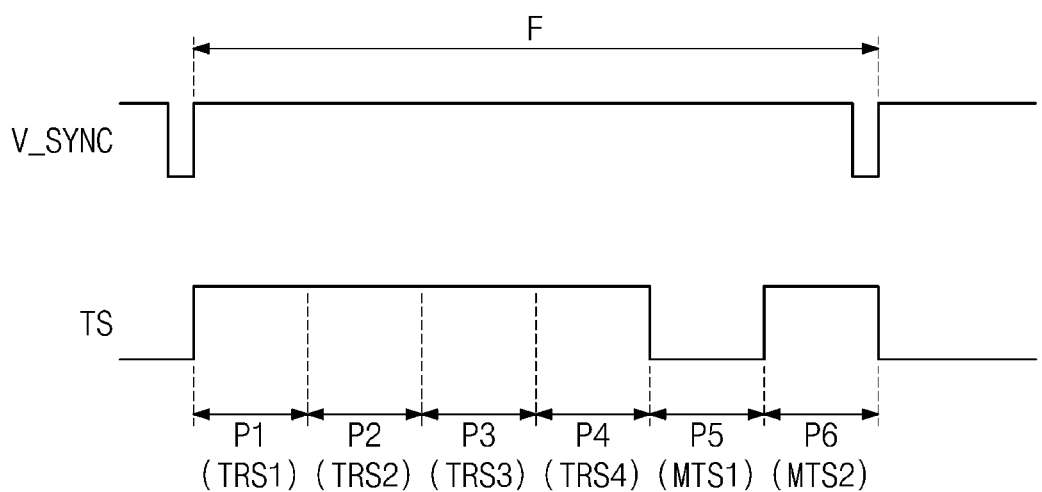
Figure 7C:
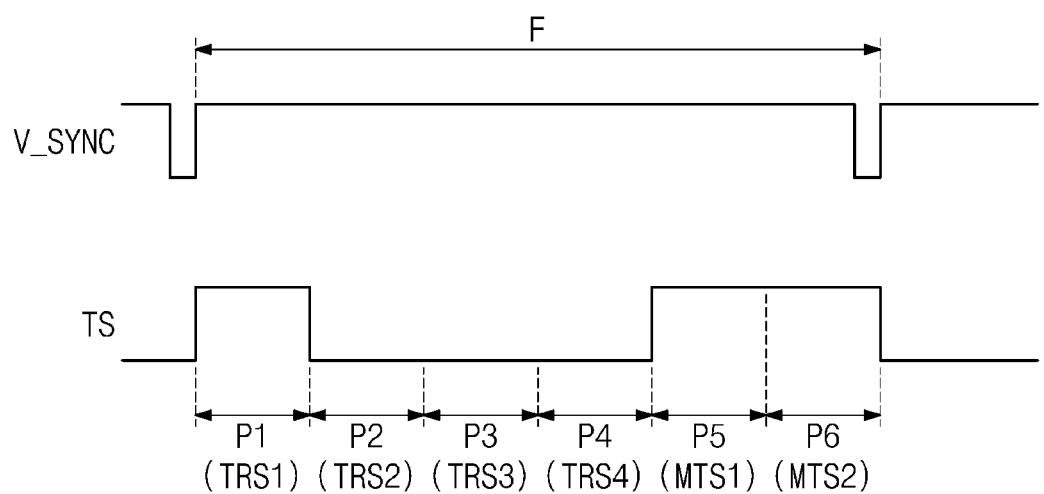

FIG. 6 is a plan view illustrating an exemplary embodiment of a contact between a display panel and a connection board and a contact between a connection board and a main board, according to the inventive concept. FIGS. 7A to 7C are timing diagrams exemplarily illustrating the test result signal TS output from the driving circuit DIC.

In the description of a display device DD2 shown in FIG. 6, the same element as that in the display device DD of FIG. 4 may be identified by the same reference number without repeating an overlapping description thereof. Referring to FIG. 6, the display device DD2 may include the display panel DPL2, a connection board FCB2, and a main circuit board MCB2.

The display panel DPL2 may include first to eighth panel pads AP1-AP8 and the panel pads AP. The first panel pad AP1 and the second panel pad AP2 may be electrically connected to each other through the first connection line CL1. The third panel pad AP3 and the fourth panel pad AP4 may be electrically connected to each other through the second connection line CL2. The fifth panel pad AP5 and the sixth panel pad AP6 may be electrically connected to each other through a third connection line CL3. The seventh panel pad AP7 and the eighth panel pad AP8 may be electrically connected to each other through a fourth connection line CL4.

The first panel pad AP1 and the second panel pad AP2 may be disposed adjacent to a side of the display panel DPL2, and the third panel pad AP3 and the fourth panel pad AP4 may be disposed adjacent to an opposite side of the display panel DPL2. In other words, the first panel pad AP1 and the second panel pad AP2 may be spaced apart from the third panel pad AP3 and the fourth panel pad AP4 in the first direction DR1.

The fifth panel pad AP5 and the sixth panel pad AP6 may be disposed adjacent to each other and between the panel pads AP, and the seventh panel pad AP7 and the eighth panel pad AP8 may be disposed adjacent to each other and between the panel pads AP. The fifth panel pad AP5 and the sixth panel pad AP6 may be spaced apart from the seventh panel pad AP7 and the eighth panel pad AP8 and disposed between the panel pads AP in the first direction DR1.

The connection board FCB2 may include first to eighth connection board pads BP1-BP8 and the connection board pads BP. The first to eighth connection board pads BP1-BP8 may be coupled to the first to eighth panel pads AP1-AP8, respectively. The connection board pads BP may be coupled to the panel pads AP, respectively. The connection board pads BP and the panel pads AP may be electrically connected to the data lines DL, the scan control line SCL, the initializing voltage line VINTL, and the voltage line VL of FIG. 2.

The connection board FCB2 may include first to eighth panel test lines TL11-TL18 and first to fourth main board test lines TL21-TL24. The driving circuit DIC may be electrically connected to the first to eighth connection board pads BP1-BP8 through the first to eighth panel test lines TL11-TL18, respectively.

In addition, the connection board FCB2 may include first to fourth main contact pads CP1-CP4 and the connection board output pad CPO. The driving circuit DIC may be electrically connected to the first to fourth main contact pads CP1-CP4 through the first to fourth main board test lines TL21-TL24, respectively.

The main circuit board MCB2 may include first to fourth main board pads DP1-DP4 and the output receiving pad DPO. The first to fourth main board pads DP1-DP4 may be coupled to the first to fourth main contact pads CP1-CP4, respectively. The output receiving pad DPO may be coupled to the connection board output pad CPO. The output receiving pad DPO may be electrically connected to the main controller MC through the second signal line SL2.

The driving circuit DIC may transmit first to fourth panel test signals to the first, third, fifth, and seventh connection board pads BP1, BP3, BP5, and BP7 through the first, third, fifth, and seventh panel test lines TL11, TL13, TL15, and TL17, respectively, and may receive first to fourth panel feedback signals from the second, fourth, sixth, and eighth connection board pads BP2, BP4, BP6, and BP8 through the second, fourth, sixth, and eighth panel test lines TL12, TL14, TL16, and TL18, respectively. The driving circuit DIC may generate a first test result signal TRS1 based on the first panel test signal and the first panel feedback signal, may generate a second test result signal TRS2 based on the second panel test signal and the second panel feedback signal, may generate a third test result signal TRS3 based on the third panel test signal and the third panel feedback signal, and may generate a fourth test result signal TRS4 based on the fourth panel test signal and the fourth panel feedback signal.

In addition, the driving circuit DIC may transmit first and second main board test signals to the first and third main contact pads CP1 and CP3 through the first and third main test lines TL21 and TL23, respectively, and may receive first and second main board feedback signals from the second and fourth main contact pads CP2 and CP4 through the second and fourth main test lines TL22 and TL24, respectively. The driving circuit DIC may generate a first main board test result signal MTS1 (in other word, "fifth test result signal") based on the first main board test signal and the first main board feedback signal, and may generate a second main board test result signal MTS2 (in other word, "sixth test result signal") based on the second main board test signal and the second main board feedback signal.

Referring to FIG. 7A, the main controller MC may provide the synchronization signal V_SYNC to the driving circuit DIC. The synchronization signal V_SYNC may be a vertical synchronization signal of which transition occurs in every frame F of an image signal. The driving circuit DIC may sequentially output the first to fourth test result signals TRS1-TRS4 and the first to second main board test result signals MTS1-MTS2 as the test result signal TS, in synchronization with the synchronization signal V_SYNC. In certain exemplary embodiments, the driving circuit DIC may sequentially output the first to fourth test result signals TRS1-TRS4 and the first to second main board test result signals MTS1-MTS2 as the test result signal TS, in synchronization with one of other synchronization signals (e.g., horizontal synchronization signal or clock signal), not with the vertical synchronization signal.

One frame F may include first to sixth periods P1-P6. The driving circuit DIC may sequentially output the first to fourth test result signals TRS1-TRS4 and the first and second main board test result signals MTS1-MTS2 as the test result signal TS, for example, in the first to sixth periods P1-P6 of one frame F, respectively.

If the first to eighth connection board pads BP1-BP8 are coupled to the first to eighth panel pads AP1-AP8 in a fully stable manner and the first to fourth main contact pads CP1-CP4 are coupled to the first to fourth main board pads DP1-DP4 in a fully stable manner, each of the first to fourth test result signals TRS1-TRS4 and the first and second main board test result signals MTS1-MTS2 may be at the first level (e.g., high level).

Referring to FIG. 7B, if the first to eighth connection board pads BP1-BP8 are coupled to the first to eighth panel pads AP1-AP8 in a fully stable manner and the third and fourth main contact pads CP3 and CP4 are coupled to the third and fourth main board pads DP3 and DP4 in a fully stable manner, each of the first to fourth test result signals TRS1-TRS4 and the second main board test result signal MTS2 may be at the first level (e.g., high level). However, if the first and second main contact pads CP1 and CP1 are not coupled to the first and second main board pads DP1 and DP2 in a fully stable manner, the first main board test result signal MTS1 may be at the second level (e.g., low level).

Referring to FIG. 7C, if the first and second connection board pads BP1 and BP2 are coupled to the first and second panel pads AP1 and AP2 in a fully stable manner and the first to fourth main contact pads CP1-CP4 are coupled to the first to fourth main board pads DP1-DP4 in a fully stable manner, each of the first test result signal TRS1 and the first and second main board test result signals MTS1-MTS2 may be at the first level (e.g., high level). However, if the third to eighth connection board pads BP3-BP8 are not coupled to the third to eighth panel pads AP3-AP8 in a fully stable manner, each of the second to fourth test result signals TRS2-TRS4 may be at the second level (e.g., low level).

The main controller MC may receive the test result signal TS from the driving circuit DIC and may determine a contact state between the display panel DPL2 and the connection board FCB2, based on the signal level of the test result signal TS, in each of the first to sixth periods P1-P6 of one frame F. For example, if, in the first period P1 of one frame F, the test result signal TS is at the high level, the main controller MC may determine that the first connection board pad BP1 and the first panel pad AP1 are coupled to each other in a fully stable manner and that the second connection board pad BP2 and the second panel pad AP2 are coupled to each other in a fully stable manner. For example, if, in the fifth period P5 of one frame F, the test result signal TS is at the low level as shown in FIG. 7B, the main controller MC may determine that the third main contact pad CP3 is not coupled to the third main board pad DP3 in a fully stable manner or the fourth main contact pad CP4 is not coupled to the fourth main board pad DP4 in a fully stable manner.

Figure 8:
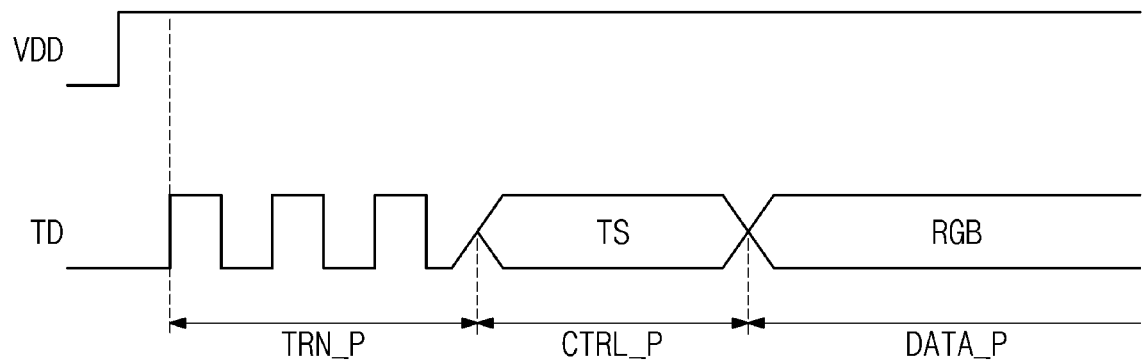
FIG. 8 is a diagram exemplarily illustrating a transmission signal between a driving circuit and a main controller.

FIG. 8 is a diagram exemplarily illustrating a transmission signal between the driving circuit DIC and the main controller MC.

Referring to FIGS. 2 and 8, the driving circuit DIC and the main controller MC may be connected to each other via one of various interface manners. Here, the interface manners may include a Universal Serial Interface ("USI"), a CPU interface, a RGB interface, a mobile industry processor interface ("MIPI"), a mobile display digital interface ("MDDI"), a compact display port ("CDP"), a mobile pixel link ("MPL"), a current mode advanced differential signaling ("CMADS"), a serial peripheral interface ("SPI"), an inter-Integrated Circuit ("I2C") interface, display port ("DP") and embedded display port ("eDP") interfaces, a camera control interface ("CCI"), a camera serial interface ("CSI"), a micro controller unit ("MCU") interface, a high definition multimedia interface ("HDMI"), or an intra panel interface ("IPI"). In addition, the interface manners may further include various high-speed serial interface manners.

The main controller MC may provide a power voltage VDD and transmission data TD to the driving circuit DIC. The main controller MC may transmit a system clock signal, a parameter signal, or the like to the driving circuit DIC, during a training period TRN_P after the supply of the power voltage VDD.

Based on the received system clock and parameter signals, the driving circuit DIC may restore clock signals, which are required for operations of the display panel DPL, and may execute an operation for optimization of a receiving operation.

The driving circuit DIC may transmit the test result signal TS to the main controller MC during a control period CTRL P (i.e., after the training period TRN_P and before a data period DATA P in which an image data signal RGB is received). The test result signal TS may be, for example, a digital signal, which indicates each contact state of the first to fourth panel pads AP1-AP4 and the first to fourth connection board pads BP1-BP4 shown in FIG. 4. For example, the test result signal TS may include a plurality of bits.

Figure 9:
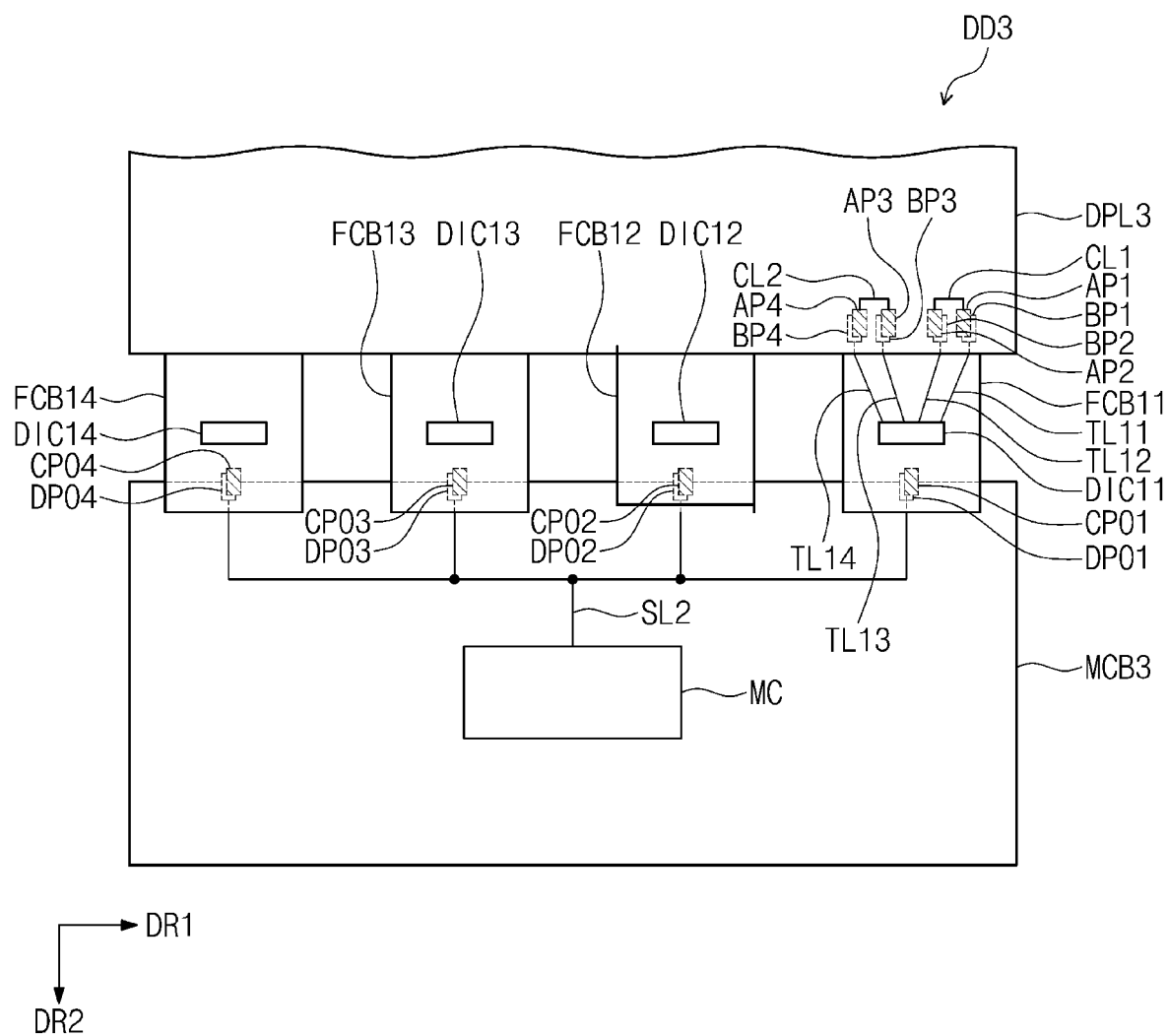
FIG. 9 is a plan view illustrating an exemplary embodiment of a display device according to the inventive concept.

FIG. 9 is a plan view illustrating an exemplary embodiment of a display device DD3 according to the inventive concept.

Referring to FIG. 9, the display device DD3 may include a display panel DPL3, first to fourth connection boards FCB11-FCB14, and a main circuit board MCB3. The first to fourth connection boards FCB11-FCB14 may include first to fourth driving circuits DIC11-DIC14, respectively. Each of the first to fourth driving circuits DIC11-DIC14 may be composed of an integrated circuit (IC). At least one of the first to fourth connection boards FCB11-FCB14 may be a flexible printed circuit board, on which the first to fourth driving circuits DIC11-DIC14 or the integrated circuits can be mounted. For example, at least one of the first to fourth connection boards FCB11-FCB14 may be a chip-on-film (COF). Each of the first to fourth connection boards FCB11-FCB14 may further include other integrated circuits, in addition to the first to fourth driving circuits DIC11-DIC14.

The display panel DPL3 may include the first to fourth panel pads AP1-AP4 corresponding to the first connection board FCB11. Although FIG. 9 illustrates only the first to fourth panel pads AP1-AP4 corresponding to the first connection board FCB11, the display panel DPL3 may further include respective sets of first to fourth panel pads corresponding to the second to fourth connection boards FCB12-FCB14. In certain exemplary embodiments, the display panel DPL3 may include sets of the first to fourth panel pads corresponding to only some of the first to fourth connection boards FCB11-FCB14. For example, the display panel DPL3 may include the first to fourth panel pads AP1-AP4 corresponding to the first connection board FCB11 and the first to fourth panel pads corresponding to the fourth connection boards FCB14 but may not include the first to fourth panel pads corresponding to the second connection board FCB12 and the third connection board FCB13.

The display panel DPL3 of FIG. 9 is illustrated to include four panel pads (i.e., the first to fourth panel pads AP1-AP4) corresponding to the first connection board FCB11, but in another exemplary embodiment, the display panel DPL3 may include only the first panel pad AP1 and the second panel pad AP2 corresponding to the first connection board FCB11.

The first panel pad AP1 and the second panel pad AP2 may be electrically connected to each other through the first connection line CL1. The third panel pad AP3 and the fourth panel pad AP4 may be electrically connected to each other through the second connection line CL2.

The first panel pad AP1 and the second panel pad AP2 may be disposed adjacent to a side of the display panel DPL3, and the third panel pad AP3 and the fourth panel pad AP4 may be not disposed adjacent to the side of the display panel DPL3. In other words, the first panel pad AP1 and the second panel pad AP2 may be spaced apart from the third panel pad AP3 and the fourth panel pad AP4 in the first direction DR1.

The first connection board FCB11 may include the first to fourth connection board pads BP1-BP4. The first to fourth connection board pads BP1-BP4 may be coupled to the first to fourth panel pads AP1-AP4, respectively. Only the first to fourth connection board pads BP1-BP4 of the first connection board FCB11 are illustrated in FIG. 9, but each of the second to fourth connection boards FCB12-FCB14 may also include first to fourth connection board pads that are substantially the same as the first to fourth connection board pads BP1-BP4 of the first connection board FCB11.

The first connection board FCB11 may further include the first to fourth panel test lines TL11-TL14. The first driving circuit DIC11 may be electrically connected to the first to fourth connection board pads BP1-BP4 through the first to fourth panel test lines TL11-TL14, respectively.

The first driving circuit DIC11 may transmit a first panel test signal to the first connection board pad BP1 through the first panel test line TL11 and may receive a first panel feedback signal from the second connection board pad BP2 through the second panel test line TL12. The first panel test signal, which is output from the first driving circuit DIC11, may be returned to the driving circuit DIC, as the first panel feedback signal, through the first panel test line TL11, the first connection board pad BP1, the first panel pad AP1, the first connection line CL1, the second panel pad AP2, the second connection board pad BP2, and the second panel test line TL12.

The first driving circuit DIC11 may transmit a second panel test signal to the third connection board pad BP3 through the third panel test line TL13 and may receive a second panel feedback signal from the fourth connection board pad BP4 through the fourth panel test line TL14. The first driving circuit DIC11 may generate the second test result signal TRS2, based on the second panel test signal and the second panel feedback signal. The second panel test signal, which is output from the first driving circuit DIC11, may be returned to the driving circuit DIC, as the second panel feedback signal, through the third panel test line TL13, the third connection board pad BP3, the third panel pad AP3, the second connection line CL2, the fourth panel pad AP4, the fourth connection board pad BP4, and the fourth panel test line TL14.

The first driving circuit DIC11 may generate the first test result signal TRS1, based on the first panel test signal, the first panel feedback signal, the second panel test signal, and the second panel feedback signal.

Similar to the first driving circuit DIC11, each of the second to fourth driving circuits DIC12-DIC14 may test a contact state between the display device DD3 and each of the second to fourth connection boards FCB12-FCB14, and may generate each of the second to fourth test result signals TRS2-TRS4.

The first to fourth connection boards FCB11-FCB14 may include first to fourth connection board output pads CPO1-CPO4, respectively. The first to fourth connection boards FCB11-FCB14 may output the first to fourth test result signals TRS1-TRS4 to the first to fourth connection board output pads CPO1-CPO4, respectively.

The main circuit board MCB3 may include first to fourth output receiving pads DPO1-DPO4. The first to fourth output receiving pads DPO1-DPO4 may be coupled to the first to fourth connection board output pads CPO1-CPO4, respectively. The first to fourth output receiving pads DPO1-DPO4 may be electrically connected to the main controller MC via the second signal line SL2.

The main controller MC may receive the test result signal TS from the first to fourth output receiving pads DPO1-DPO4 through the second signal line SL2.

FIGS. 10A and 10B are timing diagrams exemplarily illustrating the first to fourth test result signals TRS1-TRS4, which are output from the first to fourth driving circuits DIC11-DIC14, and a test result signal TS, which is received by the main controller MC.

Referring to FIG. 10A, the main controller MC may provide the synchronization signal V_SYNC to the first to fourth driving circuits DIC11-DIC14. The synchronization signal V_SYNC may be a vertical synchronization signal whose transition occurs in every frame F of an image signal. The first to fourth driving circuits DIC11-DIC14 may output the first to fourth test result signals TRS1-TRS4, respectively, in synchronization with the synchronization signal V_SYNC.

One frame F of the synchronization signal V_SYNC may include first to fourth periods P1-P4. For example, the first driving circuit DIC11 may output the first test result signal TRS1, during the first period P1 of one frame F. The second driving circuit DIC12 may output the second test result signal TRS2, during the second period P2 of one frame F. The third driving circuit DIC13 may output the third test result signal TRS3, during the third period P3 of one frame F. The fourth driving circuit DIC14 may output the fourth test result signal TRS4, during the fourth period P4 of one frame F.

The second signal line SL2 may be connected in common to the first to fourth output receiving pads DPO1-DPO4. The main controller MC may receive the first to fourth test result signals TRS1-TRS4 as the test result signal TS. The main controller MC may restore the test result signal TS into the first to fourth test result signals TRS1-TRS4 in synchronization with the synchronization signal V_SYNC.

For example, if the first to fourth connection board pads BP1-BP4 of the first connection board FCB11 are coupled to the first to fourth panel pads AP1-AP4 in a fully stable manner, the first test result signal TRS1 may be at the first level (e.g., high level).

Similarly, if the first to fourth connection board pads (not shown) of the second connection board FCB12 are coupled to corresponding panel pads of the display panel DPL3 in a fully stable manner, the second test result signal TRS2 may be at the first level (e.g., high level). If the first to fourth connection board pads (not shown) of the third connection board FCB13 are coupled to corresponding panel pads of the display panel DPL3 in a fully stable manner, the third test result signal TRS3 may be at the first level (e.g., high level). If the first to fourth connection board pads (not shown) of the fourth connection board FCB14 are coupled to corresponding panel pads of the display panel DPL3 in a fully stable manner, the fourth test result signal TRS4 may be at the first level (e.g., high level).

In this case, as shown in FIG. 10A, the first to fourth test result signals TRS1-TRS4 may be at the first level (e.g., high level) in each of the first to fourth periods P1-P4, and the test result signal TS may be at the first level (e.g., high level) in all of the first to fourth periods P1-P4.

Referring to FIG. 10B, if the first to fourth connection board pads BP1-BP4 of the first connection board FCB11 are coupled to the first to fourth panel pads AP1-AP4 in a fully stable manner, the first test result signal TRS1 may be at the first level (e.g., high level). If the first to fourth connection board pads (not shown) of the second connection board FCB12 are coupled to panel pads of the display panel DPL3 in a fully stable manner, the second test result signal TRS2 may be at the first level (e.g., high level). If at least one of the first to fourth connection board pads (not shown) of the third connection board FCB13 is not coupled to a corresponding one of panel pads of the display panel DPL3 in a fully stable manner, the third test result signal TRS3 may be at the second level (e.g., low level). If at least one of the first to fourth connection board pads (not shown) of the fourth connection board FCB14 is not coupled to a corresponding one of panel pads of the display panel DPL3 in a fully stable manner, the fourth test result signal TRS4 may be at the second level (e.g., low level).

In this case, as shown in FIG. 10B, the first test result signal TRS1 and the second test result signal TRS2 may be at the first level (e.g., high level) in each of the first period P1 and the second period P2, and the third test result signal TRS3 and the fourth test result signal TRS4 may be at the second level (e.g., low level) in each of the third period P3 and the fourth period P4.

Accordingly, the test result signal TS may be at the first level (e.g., high level) in each of the first period P1 and the second period P2 and may be at the second level (e.g., low level) in each of the third period P3 and the fourth period P4.

Figure 11:
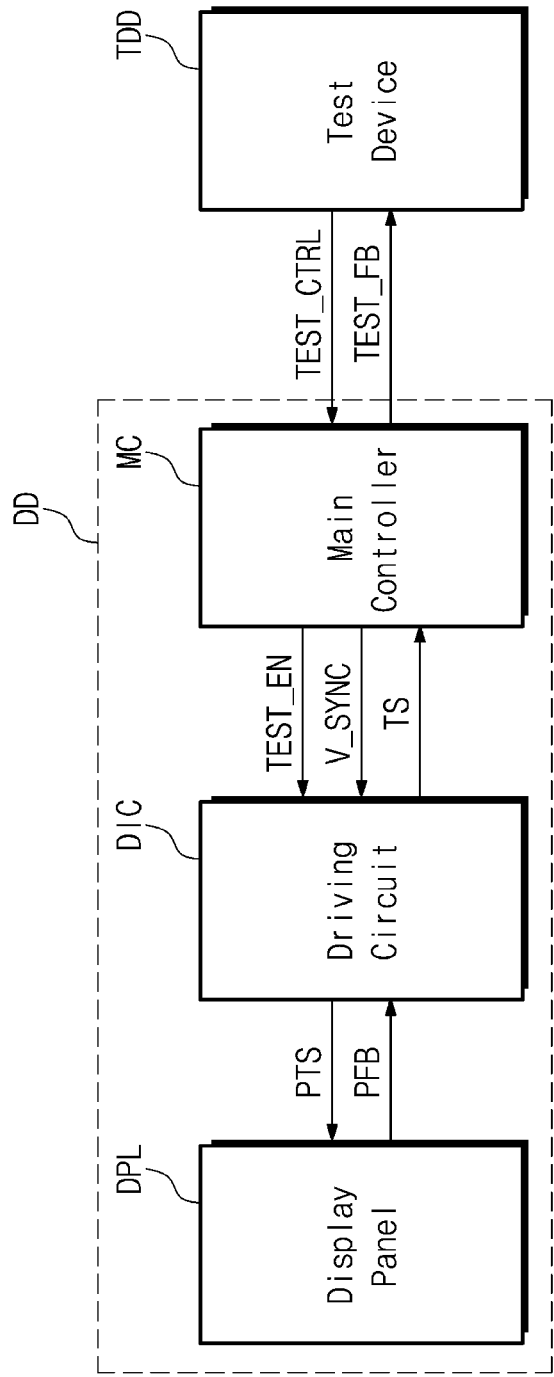
FIG. 11 is a diagram illustrating an example of a test device connected to a display device.

FIG. 11 is a diagram illustrating an example of a test device TDD connected to the display device DD.

Referring to FIG. 11, the display device DD may include the display panel DPL, the driving circuit DIC, and the main controller MC. The driving circuit DIC may be provided in the connection board FCB shown in FIG. 2, and the main controller MC may be provided in the main circuit board MCB shown in FIG. 2. The test device TDD may be electrically connected to the display device DD.

The test device TDD may output a test control signal TEST_CTRL to the main controller MC. The test control signal TEST_CTRL may include signals, which are used to control a testing operation of the driving circuit DIC by the main controller MC.

The main controller MC may transmit a test enable signal TEST_EN and the synchronization signal V_SYNC to the driving circuit DIC in response to the test control signal TEST_CTRL. The driving circuit DIC may transmit a panel test signal PTS to the display panel DPL and receive a panel feedback signal PFB, in response to the test enable signal TEST_EN. For example, the panel test signal PTS may include the first panel test signal, which is output from the driving circuit DIC of FIG. 4 to the first panel test line TL11, and the second panel test signal, which is provided to the third panel test line TL13. In addition, the panel feedback signal PFB may include the first panel feedback signal, which is received from the second panel test line TL12 of FIG. 4, and the second panel feedback signal, which is received from the fourth panel test line TL14.

The driving circuit DIC may provide the test result signal TS, which is generated based on the panel test signal PTS and the panel feedback signal PFB, to the main controller MC in synchronization with the synchronization signal V_SYNC.

The main controller MC may provide the test result signal TS, which will be used as a test feedback signal TEST_FB, to the test device TDD.

The test device TDD may display the test feedback signal TEST_FB to a user or manufacturer. Thus, the user can easily obtain information on contact states between the panel pads of the display panel DPL and the connection board pads of the driving circuit DIC.

In a display device according to an exemplary embodiment of the inventive concept, it may be possible to test whether a display panel is normally coupled to a connection board. In addition, a main controller can obtain information on a position of an abnormally coupled pad, which may occur when pads of the connection board are coupled to panel pads of the display panel. Thus, it may be possible to improve efficiency in a process of fabricating a display device.

While exemplary embodiments of the inventive concepts have been particularly shown and described, it will be understood by one of ordinary skill in the art that variations in form and detail may be made therein without departing from the spirit and scope of the attached claims.

What is claimed is:

1. A display device, comprising:
a display panel comprising first to fourth panel pads; and
a connection board comprising first to fourth connection board pads coupled to the first to fourth panel pads, respectively,
wherein the first panel pad and the second panel pad are electrically connected to each other,
the third panel pad and the fourth panel pad are electrically connected to each other, and
the connection board comprises a driving circuit which is connected to the first to fourth connection board pads, generates a first test result signal based on a first panel test signal transmitted to the first connection board pad and a first panel feedback signal received from the second connection board pad, generates a second test result signal based on a second panel test signal transmitted to the third connection board pad and a second panel feedback signal received from the fourth connection board pad, and sequentially outputs the first test result signal and the second test result signal as a test result signal.

2. The display device of claim 1, wherein the driving circuit is an integrated circuit, and the connection board is composed of a chip-on-film, on which the driving circuit is mounted.

3. The display device of claim 1, wherein the first panel pad and the second panel pad are arranged in a side region of the display panel, and
the third panel pad and the fourth panel pad are spaced apart from the first panel pad and the second panel pad and are arranged in an opposite side region of the display panel.

4. The display device of claim 1, wherein the driving circuit generates the first test result signal of a first level, when a first difference between the first panel test signal and the first panel feedback signal is smaller than a predetermined value, and generates the first test result signal of a second level different from the first level, when the first difference is greater than or equal to the predetermined value, and
the driving circuit generates the second test result signal of the first level, when a second difference between the second panel test signal and the second panel feedback signal is smaller than the predetermined value, and generates the second test result signal of the second level, when the second difference is greater than or equal to the predetermined value.

5. The display device of claim 1, wherein the display panel further comprises a plurality of panel pads,
the connection board further comprises a plurality of connection board pads coupled to the plurality of panel pads, respectively, and
at least one of the plurality of panel pads and the plurality of connection board pads is an image signal pad used to transmit an image signal.

6. The display device of claim 5, wherein the first panel pad and the second panel pad are arranged at a side of the plurality of panel pads, and
the third panel pad and the fourth panel pad are arranged at an opposite side of the plurality of panel pads.

7. The display device of claim 6, wherein the display panel further comprises a fifth panel pad and a sixth panel pad electrically connected to each other, and a seventh panel pad and an eighth panel pad electrically connected to each other,
the connection board further comprises fifth to eighth connection board pads coupled to the fifth to eighth panel pads, respectively, and
the driving circuit is electrically connected to the fifth to eighth connection board pads, further generates a third test result signal based on a fifth panel test signal transmitted to the fifth connection board pad and a third panel feedback signal received from the sixth connection board pad, generates a fourth test result signal based on a fourth panel test signal transmitted to the seventh connection board pad and a fourth panel feedback signal received from the eighth connection board pad, and sequentially outputs the first to fourth test result signals as the test result signal.

8. The display device of claim 7, wherein the fifth to eighth panel pads are arranged between the plurality of panel pads.

9. The display device of claim 8, wherein the connection board further comprises a connection board output pad, and
the driving circuit sequentially outputs the first to fourth test result signals to the connection board output pad, during one frame.

10. The display device of claim 9, further comprising a main circuit board comprising an output receiving pad coupled to the connection board output pad, wherein the main circuit board further comprises a main controller, which receives the first test result signal and the second test result signal through the output receiving pad.

11. The display device of claim 10, wherein the main circuit board further comprises first to fourth main board pads,
the connection board further comprises first to fourth main contact pads coupled to the first to fourth main board pads, respectively, and
the driving circuit is electrically connected to the first to fourth main board pads, further generates a fifth test result signal based on a first main board test signal transmitted to the first main contact pad and a first main board feedback signal received from the second main contact pad, generates a sixth test result signal based on a second main board test signal transmitted to the third main contact pad and a second main board feedback signal received from the fourth main contact pad, and sequentially outputs the first to sixth test result signals as the test result signal.

12. The display device of claim 11, wherein the driving circuit sequentially outputs the first to sixth test result signals to the connection board output pad, during one frame.

13. The display device of claim 11, wherein the first main board pad and the second main board pad are arranged in a side region of the main circuit board, and
the third main board pad and the fourth main board pad are spaced apart from the first main board pad and the second main board pad and are arranged in an opposite side region of the main circuit board.

14. A display device, comprising:
a display panel comprising a plurality of panel pads;
a plurality of connection boards, each of which comprises first to fourth connection board pads and a connection board output pad; and
a main circuit board comprising a plurality of output receiving pads coupled to the connection board output pads of the plurality of connection boards,
wherein the plurality of panel pads comprises first and second panel pads electrically connected to each other, and third and fourth panel pads electrically connected to each other,
the first to fourth connection board pads of one of the plurality of connection boards are coupled to the first to fourth panel pads, respectively,
each of the plurality of connection boards comprises a driving circuit, and
the driving circuit of the one of the plurality of connection boards is electrically connected to the first to fourth connection board pads, generates a first test result signal based on a first panel test signal transmitted to the first connection board pad, a first panel feedback signal received from the second connection board pad, a second panel test signal transmitted to the third connection board pad, and a second panel feedback signal received from the fourth connection board pad, and outputs the first test result signal to the connection board output pad.

15. The display device of claim 14, wherein each of the driving circuits is an integrated circuit, and each of the plurality of connection boards is composed of a chip-on-film, on which the driving circuit is mounted.

16. The display device of claim 14, wherein the driving circuit generates the first test result signal of a first level, when a first difference between the first panel test signal and the first panel feedback signal is smaller than a predetermined value and a second difference between the second panel test signal and the second panel feedback signal is smaller than the predetermined value, and generates the first test result signal of a second level different from the first level, when at least one of the first difference and the second difference is greater than or equal to the predetermined value.

17. The display device of claim 14, wherein each of the driving circuits outputs the first test result signal in a corresponding one of different periods of one frame.

18. A method of testing a pad contact state of a display device comprising a display panel and a connection board, the display panel comprising a first panel pad and a second panel pad electrically connected to each other, and a third panel pad and a fourth panel pad electrically connected to each other, and the connection board comprising first to fourth connection board pads, the method comprising:
coupling the first to fourth connection board pads to the first to fourth panel pads, respectively;
transmitting a first panel test signal to the first connection board pad and transmitting a second panel test signal to the third connection board pad;
receiving a first panel feedback signal from the second connection board pad and receiving a second panel feedback signal from the fourth connection board pad;
generating a first test result signal based on a first difference between the first panel test signal and the first panel feedback signal;
generating a second test result signal based on a second difference between the second panel test signal and the second panel feedback signal; and
sequentially outputting the first test result signal and the second test result signal.

19. The method of claim 18, wherein the connection board further comprises a connection board output pad, and
the outputting of the first and second test result signals is executed to sequentially output the first test result signal and the second test result signal to the connection board output pad during one frame.

20. The method of claim 18, wherein the outputting of the first and second test result signals is executed to generate the first test result signal of a first level, when the first difference between the first panel test signal and the first panel feedback signal is smaller than a predetermined value, and to generate the first test result signal of a second level different from the first level, when the first difference is greater than or equal to the predetermined value, and
the outputting of the first and second test result signals is further executed to generate the second test result signal of the first level, when the second difference between the second panel test signal and the second panel feedback signal is smaller than the predetermined value, and to generate the second test result signal of the second level, when the second difference is greater than or equal to the predetermined value.

* * * * *